US006351409B1

(12) United States Patent
Rizzo et al.

(10) Patent No.: US 6,351,409 B1
(45) Date of Patent: Feb. 26, 2002

(54) MRAM WRITE APPARATUS AND METHOD

(75) Inventors: Nicholas D. Rizzo, Gilbert; Bradley N. Engel, Chandler, both of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/754,458

(22) Filed: Jan. 4, 2001

(51) Int. Cl.[7] .............................................. G11C 11/02
(52) U.S. Cl. ...................... 365/158; 365/225.7
(58) Field of Search ........................ 365/225.5, 158, 365/157, 171, 173

(56) References Cited

U.S. PATENT DOCUMENTS 5,946,227 A * 8/1999 Naji ............................ 365/158
6,163,477 A * 12/2000 Tran ............................ 365/158
6,205,051 B1 * 3/2001 Brug et al. ................. 365/225.5
6,272,040 B1 * 8/2001 Salter et al. ................ 365/225.5
6,285,581 B1 * 9/2001 Tehrani et al. .............. 365/158

\* cited by examiner

*Primary Examiner*—Tan T. Nguyen
(74) *Attorney, Agent, or Firm*—William E. Koch

(57) ABSTRACT

An MRAM cell and a method of programming the cell are disclosed. The cell includes a free layer of magnetic material having a ferromagnetic resonance with a resonant frequency, the ferromagnetic resonance having a Q greater than one. A hard axis and an easy axis write line are positioned in magnetic communication with the free layer. A cladding layer partially surrounds the hard axis write line and has a similar resonant frequency and with a ferromagnetic resonance Q greater than one. A write signal including the resonant frequency is applied to the hard axis write line and simultaneously a write pulse is applied to the easy axis write line. The Qs of the cell and the cladding layer multiply to substantially increase the switching magnetic field or reduce the current required to provide the same magnetic field.

36 Claims, 3 Drawing Sheets

MRAM WRITE APPARATUS AND METHOD

FIELD OF THE INVENTION

This invention relates to the magnetoresistive type of information memories and more particularly to apparatus and methods of writing or programming magnetoresistive memories.

BACKGROUND OF THE INVENTION

The architecture for Magnetoresistive Random Access Memory (MRAM) is composed of a plurality or array of memory cells and a plurality of digit line and bit line intersections. The magnetoresistive memory cell generally used is composed of a magnetic tunnel junction (MTJ), an isolation transistor, and the intersection of digit and bit lines. It should be understood, however, that the present invention is not limited to MTJ cells and this type of cell and the associated circuitry is only used for exemplary purposes. The isolation transistor is generally a N-channel field effect transistor (FET). An interconnect stack connects the isolation transistor to the MTJ device, to the bit line, and to the digit line used to create part of the magnetic field for programming the MRAM cell.

MTJ memory cells generally include a non-magnetic conductor forming a lower electrical contact, a pinned magnetic layer, a tunnel barrier layer positioned on the pinned layer, and a free magnetic layer positioned on the tunnel barrier layer with an upper contact on the free magnetic layer.

The pinned layer of magnetic material has a magnetic vector that is always pointed in the same direction. The magnetic vector of the free layer is free, but constrained by the physical size of the layer and other anisotropies, to point in either of two directions. An MTJ cell is used by connecting it in a circuit such that electricity flows vertically through the cell from one of the layers to the other. The MTJ cell can be electrically represented as a resistor and the size of the resistance depends upon the orientation of the magnetic vectors. As is understood by those skilled in the art, the MTJ cell has a relatively high resistance when the magnetic vectors are misaligned (point in opposite directions) and a relatively low resistance when the magnetic vectors are aligned. Additional information as to the fabrication and operation of MTJ memory cells can be found in U.S. Pat. No. 5,702,831, entitled "Multi-Layer Magnetic Tunneling Junction Memory Cells", issued Mar. 31, 1998, and incorporated herein by reference.

A bit line is generally associated with each column of an array of MTJ cells and a digit line is associated with each row of the array. The bit lines and digit lines are used to address individual cells in the array for both reading and writing or programming information in the array. Programming of a selected cell is accomplished by passing predetermined currents through the digit and bit lines intersecting at the selected cell. Several problems are prevalent in the standard memory architecture, including high programming currents and insufficient spacing between closely packed cells during programming.

Thus, it is desirable to provide improved MRAM memories and methods of programming that overcome these problems.

BRIEF DESCRIPTION OF THE DRAWINGS

The specific objects and advantages of the present invention will become readily apparent to those skilled in the art from the following detailed description thereof taken in conjunction with the drawings in which.

DESCRIPTION OF A PREFERRED EMBODIMENT

Figure 1:
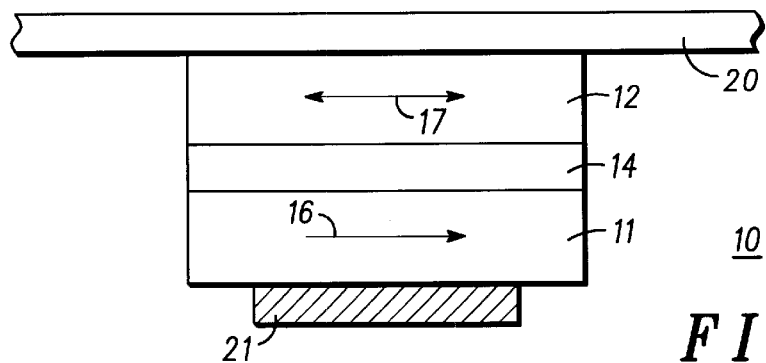
FIG. 1 is a simplified sectional view of an MTJ memory cell in accordance with the present invention.

Turning now to the figures and specifically to FIG. 1, a simplified sectional view of a magnetic tunneling junction (MTJ) cell 10, generally as used in the present disclosure, is illustrated to briefly describe the operation of this type of memory cell. It will be understood by those skilled in the art that other types of magnetoresistive memory cells (MRAM) can be used in conjunction with the present invention and the MTJ described is being used simply for exemplary purposes. MTJ cell 10 includes a pair of layers 11 and 12 of magnetic material. Layers 11 and 12 have a layer 14 of tunnel barrier material sandwiched therebetween. As is known in the art, layers 11 and 12 are each generally formed of a plurality of layers or sublayers of magnetic material, such as cobalt (Co), nickel (Ni), iron (Fe), and the like. Layer 14 is formed of some nonconductive material such as aluminum oxide, aluminum nitride, or the like.

One of the layers of magnetic material, layer 11 in this description, has a larger switching field so that its magnetic vector, represented by arrow 16, hereinafter vector 16, is always pointed in the same direction (pinned) when the applied magnetic field is less than its switching field. The magnetic vector of layer 12, represented by arrow 17, hereinafter vector 17, has a smaller switching field and is free, but constrained by the physical size of layer 12, to point in either of two directions (represented by the double arrowheads) when the applied magnetic field is larger than its switching field. Additional information as to the fabrication and operation of MTJ cells can be found in U.S. Pat. No. 5,702,831, entitled "Multi-Layer Magnetic Tunneling Junction Memory Cells", issued Mar. 31, 1998, and incorporated herein by reference.

Cell 10 is used by connecting it in a circuit such that electricity flows vertically through cell 10 from one of the layers 11 or 12 to the other. Cell 10 can be electrically represented as a resistor and the size of the resistance depends upon the orientation of magnetic vectors 16 and 17. As is understood by those skilled in the art, cell 10 has a relatively high resistance when magnetic vectors 16 and 17 are misaligned (point in opposite directions) and a relatively low resistance when magnetic vectors 16 and 17 are aligned.

Cell 10 also has a pair of orthogonal write lines 20 and 21 positioned in magnetic communication therewith. Generally, in a typical array of memory cells (not shown), write line 20 is oriented adjacent a column of cells and write line 21 is oriented adjacent a row of cells. That is, each column of cells in the array has an associated write line similar to write line 20 and each row of cells has an associated write line similar to write line 21. Further, the amount of magnetic field required to switch the free magnetic vector (vector 17) in any selected cell 10 in the array is achieved through a combination of the currents flowing in both of the write lines that cross at the selected or addressed cell.

Figure 2:
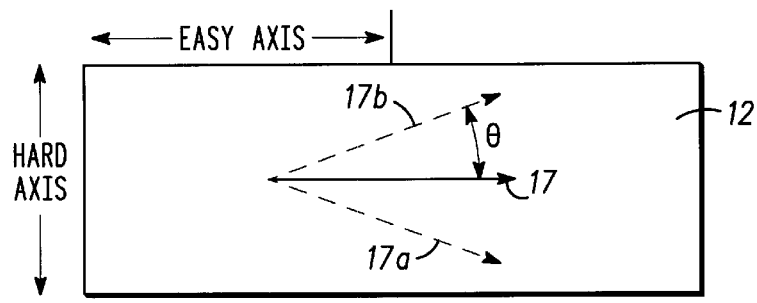
FIG. 2 is a simplified view in top plan of the free magnetic layer of FIG. 1, schematically illustrating movement of the magnetic vector.

Referring additionally to FIG. 2, it can be seen that at least layer 12 of cell 10 has a generally rectangularly shaped cross-section with a longitudinal axis extending parallel to vector 17 and a transverse axis extending perpendicular to vector 17. In practice, layers 11 and 14 may have a different configuration but are illustrated as having a shape similar to layer 12 for simplicity of this disclosure. Also, while write line 20 is positioned above cell 10 and write line 21 is positioned below cell 10 in this example, other positions may be used, as long as the magnetic field produced by electrical current in lines 20 and 21 is sufficient to provide the desired switching action. In this preferred embodiment, the magnetic axis parallel to the longitudinal axis is referred to as the easy axis and the magnetic axis parallel to the transverse axis is referred to as the hard axis. Further, in this preferred embodiment, write line 20 is positioned to produce a magnetic field parallel to the hard axis and write line 21 is positioned to produce a magnetic field parallel to the easy axis.

The magnetic field produced by current flowing in write line 20 is sufficient to partially switch vector 17 either clockwise into position 17a or counterclockwise into position 17b. Current flowing in write line 21 must then be large enough to produce a magnetic field that will move vector 17 the remainder of the way beyond 90 degrees to cause it to switch and point in the opposite direction. In the prior art, a pulse of current several to tens of nanoseconds long (DC) is applied to each write line 20 and 21 simultaneously. It will of course be understood by those skilled in the art that currents applied simultaneously to write lines 20 and 21 produce the complete switching of vector 17 well within the time of the pulses and the partial switching described above is simply included for explanation.

Cell 10 (generally layer 12) has a ferromagnetic resonance at a frequency approximately proportional to the square root of $M_s$ ($H_k \pm H_E$), where $M_s$ is the saturation magnetization and $H_k$ is the anisotropy field of the material forming layer 12. It will be understood that the anisotropy field $H_k$ includes factors such as shape anisotropy and intrinsic anisotropy. Also, it should be noted that the field excitation produced along the easy axis (designated $H_E$ for convenience) is either subtracted from or added to the total anisotropy field $H_k$. When the easy axis excitation is in a direction to switch cell 10, $H_E$ is subtracted from $H_k$. Thus, in the normal switching procedure of cell 10, energization along the easy axis reduces the ferromagnetic resonance frequency of cell 10 (specifically layer 12). This phenomenon is included in the term "resonant frequency" or "associated resonant frequency", either of which is defined as the resonant frequency of the cell during normal operation.

Figure 3:
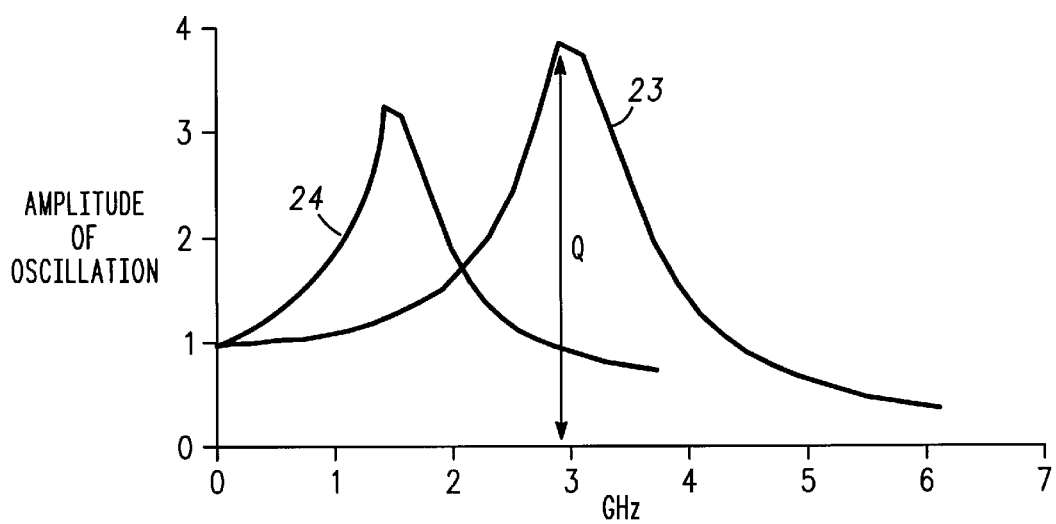
FIG. 3 is a graphical representation of the quality factor, Q, of the resonance of the free magnetic layer of FIG. 1.

Referring additionally to FIG. 3, a graphical representation of the quality factor, $Q_b$, of the resonance of free magnetic layer 12 of FIG. 1 is illustrated, where the quality factor is defined as the ratio of the amplitude of oscillation at a given frequency to the amplitude of oscillation at DC. A first peak 23 illustrates the resonant frequency of magnetic layer 12 and a second peak 24 illustrates the lowered resonant frequency of magnetic layer 12 with a write signal applied to the easy axis (write line 21). From this graph it can be seen that in a typical bit or cell 10, such as described above, with a total anisotropy field $H_k$ of 90 Oersted (Oe), the ferromagnetic resonance of bit or cell 10 is approximately 1.7 GHz and the quality factor ($Q_b$) peaks sharply at the resonant frequency. Also, it can be seen that adjacent cells with no easy axis signal applied will have a resonance frequency slightly less than 3 GHz. In this specific example the $Q_b$ at ferromagnetic resonance is three to four times greater, and generally greater than one, than the Q at DC or zero frequency. If the reversing magnetic field is applied at the resonant frequency, the response of cell 10 will be approximately $Q_b$ times larger than if an off resonant frequency is used. Therefore, a given switching or write current will generate an effective field that is $Q_b$ times larger at the resonant frequency.

Here it should be noted that the sharp peak of the quality factor Q at resonance can add some additional selectivity to cell 10. Adding to this selectivity is the fact that the pulse supplied to the easy axis tends to reduce the ferromagnetic resonance of the cell being addressed. Any adjacent cell not exposed to the pulse supplied to the easy axis will have a higher associated resonant frequency. Thus, for adjacent cells that might be affected by the write currents of the addressed cell, it is believed that the ferromagnetic resonance will generally be at a higher frequency. The write currents applied to the addressed cell will thus be less likely to be large enough to produce a switching action in any of the adjacent cells.

Figure 4:
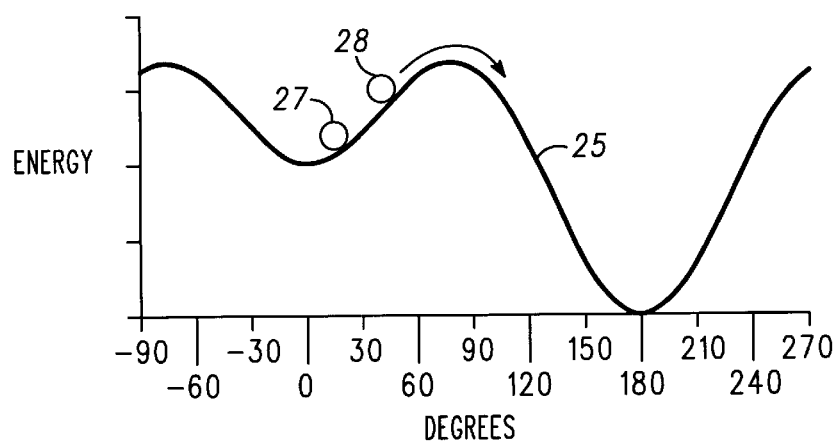
FIG. 4 is a graphical simulation of the movement of the magnetic vector of the free magnetic layer of FIG. 1.

This resonant frequency response is represented in FIG. 4, which illustrates an energy track 25 including a first valley at zero degrees, an energy barrier at ninety degrees, and a second valley at 180 degrees. The energy valleys represent the two stable positions of vector 17 (FIG. 1) and the energy barrier represents the energy required to switch from one stable position to the other. A first ball 27 represents vector 17 with a DC pulse applied to the hard axis and a second ball 28 represents vector 17 with a resonant frequency applied to the hard axis. Ball 27, which is driven by the DC pulse, requires much more energy to get over the barrier than ball 28, which is driven at the resonant frequency.

Here it should be noted that the depicted energy system is sometimes referred to as a "soft" system because the slope of the energy barrier is reduced near the apex of the energy barrier. Because of this reduction in the slope of the energy, the associated resonant frequency is reduced in this region.

Therefore, the frequency of current applied to the hard axis could be change for optimal energy transfer as the slope changes. Thus, in some specific embodiments, it may be practical to provide a few cycles of current at the resonant frequency of cell 10 and to change the frequency slightly as the slope of the energy curve changes. This varying frequency signal would consist of a nonsinusoidal or anharmonic write signal.

Figure 5:
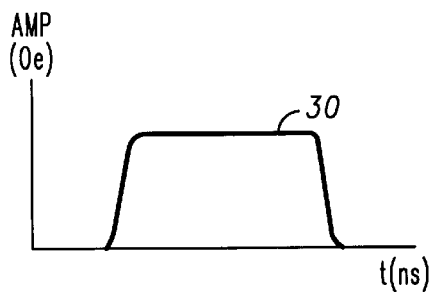
FIG. 5 is a graphical representation of a write pulse applied to the easy axis.
Figure 6:
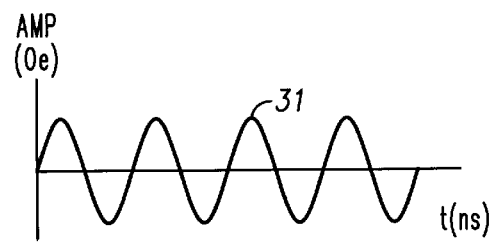
FIG. 6 is a graphical representation of a write signal, including an associated resonant frequency, applied to the hard axis.
Figure 7:
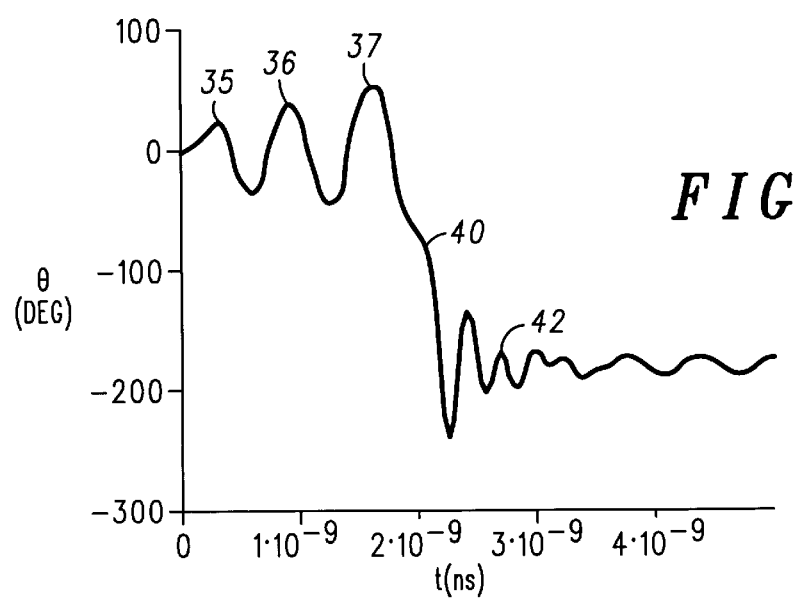
FIG. 7 is a graphical simulation of the movement of the magnetic vector of the free magnetic layer of FIG. 1 under the impetus of the pulse and signal illustrated in FIGS. 5 and 6.

In this specific embodiment, a pulse 30 of current (illustrated in FIG. 5) is applied to write line 21, or the easy axis. Pulse 30 is approximately 30 nanoseconds long. A write signal 31, including a plurality of cycles of the associated resonant frequency (graphically represented in FIG. 6), is simultaneously applied to write line 20, or the hard axis. Here it should be understood that pulse 30 and write signal 31 are applied to the easy and hard axes, respectively, in this preferred embodiment, but they could be reversed in some specific applications. Referring additionally to FIG. 7, a graphical representation is illustrated of the movement of magnetic vector 17 of free magnetic layer 12 (FIG. 1) under the impetus of the currents applied to write lines 20 and 21. This representation was generated from a Landau Lifshitz simulation of bit reversal in a single domain particle with an $H_k$ of 90 Oersted and an HE of 40 Oersted.

In the representation of FIG. 7, three peaks 35, 36, and 37 represent the application of three cycles of the resonant frequency applied to write line 20. It can be seen that peaks 35, 36, and 37 are progressively higher indicating that each cycle of the applied write current bumps magnetic vector 17 a little farther in the switching direction until the energy barrier is finally overcome and vector 17 switches to the opposite stable position (indicated by 40). Any additional cycles of write current (illustrated at 42) have little effect since vector 17 is switched and the easy axis current is now in a non-switching direction. The switching fields calculated from the above simulation showed that a DC switching pulse applied to the hard axis required a 25 Oersted field to produce the switching and a switching signal at approximately 1.7 GHz (the resonant frequency) applied to the hard axis required a 9 Oersted field to produce the switching.

Figure 8:
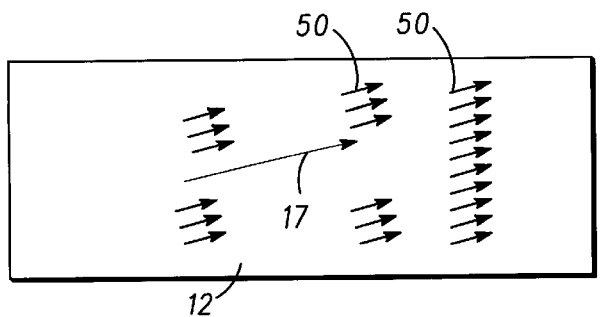
FIG. 8 is a simplified view in top plan of the free magnetic layer of FIG. 1 illustrating uniform magnetization when a resonance frequency signal that includes a prime or zero mode is applied.

It will of course be understood by those skilled in the art that layer 12 actually includes a large number of very small coherent magnetic sub-units (represented in FIG. 8 by arrows designated 50) in which the magnetization can be assumed uniform. Also, it will be understood that magnetic vector 17 simply represents an average magnetic orientation of sub-units 50. With reference to sub-units 50, when a magnetic field is applied to the hard axis at the resonant frequency, each sub-unit SO is affected in accordance with the magnetic field applied directly to it. In FIG. 8, the magnetic field is applied at a resonant frequency that includes a uniform magnetization mode. In the uniform magnetization mode the magnetization direction of sub-units 50 is substantially the same across the width of layer 12.

Figure 9:
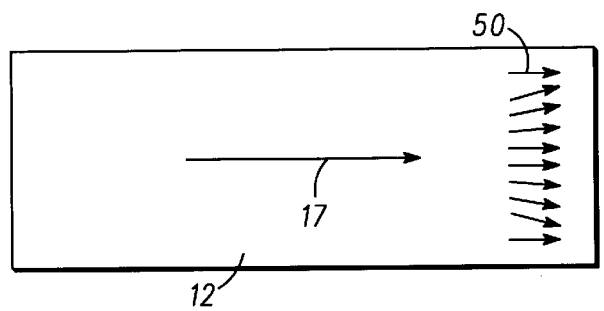
FIG. 9 is a simplified view in top plan of the free magnetic layer of FIG. 1 illustrating nonuniform magnetization when a resonance frequency signal that includes a higher order mode is applied.
Figure 10:
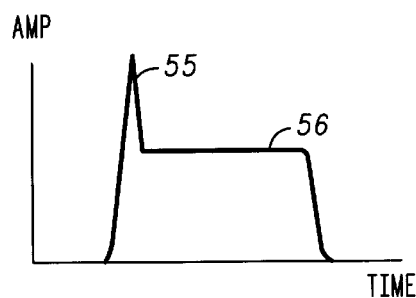
FIG. 10 is a graphical representation of a write signal including higher order resonance frequency signals.
Figure 11:
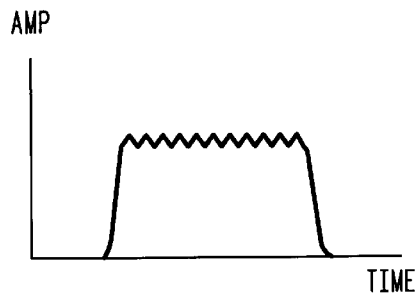
FIG. 11 is another graphical representation of a write signal including higher order resonance frequency signals.
Figure 12:
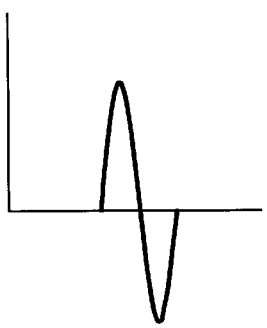
FIG. 12 is another graphical representation of a write signal including higher order resonance frequency signals.
Figure 13:
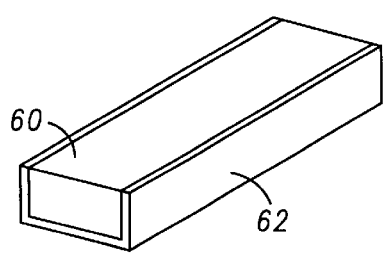
FIG. 13 is an isometric view of a hard axis write line with a cladding layer in accordance with the present invention.

Referring additionally to FIG. 9, the applied field is at a higher frequency (which includes a higher mode of resonance hereinafter referred to as a nonuniform magnetization mode) so that one or more magnetic nodes are produced across the width of layer 12. Thus, individual sub-units 50 point in different directions. Those skilled in the art will recognize that magnons have been generated. It will be noted, however, that vector 17 still indicates the average direction. Because of the different movements of sub-units 50, the amplitude M, is decreased so that the shape anisotropy is reduced and reversal of the magnetization (switching of vector 17) is easier. Thus, in some specific applications the switching field required could be reduced by dumping high frequency field energy into bit 10 through an overshoot spike 55 at an edge of a switching pulse 56, as illustrated in FIG. 10. The high frequency energy might alternatively be applied to cell 10 as a high frequency or frequencies 58 modulated onto a switching pulse 59, as illustrated in FIG. 11, or applied as a bipolar spike to the hard axis, as illustrated in FIG. 12. Here it will of course be understood that write signal 31 (see FIG. 6) could either be a higher frequency signal or could contain higher frequency signals.

Turning now to FIG. 12, an isometric view is illustrated of a hard axis write line 60 with a cladding layer 62 formed thereon in accordance with the present invention. Cladding layer 62 is formed of magnetic material which directs most or all of the magnetic field produced by write line 60 into the associated cell. A more complete description of the construction and operation of cladding layers can be found in U.S. Pat. No. 5,659,499, entitled "magnetic Memory and Method Therefore", incorporated herein by reference.

Here it should be noted that magnetic cladding layer 62 also has a magnetic resonance that is proportional to the square root of $(M_s H_k)$, where $M_s$ is the saturation magnetization and $H_k$ is the anisotropy field of the material forming cladding layer 62. As previously explained, the anisotropy field $H_k$ includes factors such as shape anisotropy and intrinsic anisotropy. For example, by adjusting the thickness of cladding layer 62 the anisotropy field $H_k$ can be adjusted so that the resonant frequency of cladding layer 62 is substantially equal to the resonant frequency of cell 10. Also, when the current applied to hard axis write line 60 is at the resonant frequency a quality factor Qc of 2 to 4 is realized for typical ferromagnetic materials, although more or less is possible. Therefore, the magnetization rotation of the cladding layer will be Qc times greater and thus the field produced by the cladding layer will be Qc times greater when operating on resonance. Further, when the resonant frequency of cladding layer 62 is adjusted so that it is substantially the same as the resonant frequency of cell 10, then the total effective increase in magnetic field when operating on resonance is approximately proportional to QbQc or the same field could be applied for approximately 1/QbQc less current. It will of course be understood that the improved cell and the improved cladding layer can each be used separately or in conjunction with each other for the additional advantage.

Thus, new and improved MRAM write apparatus and methods of writing or programming are disclosed. The use of a resonant frequency write signal in conjunction with either the hard or easy axis does not introduce any substantial complications and can substantially reduce the energy (current) required for the writing operation. Further, the use of a cladding layer at the ferromagnetic resonance of the cell increases the applied magnetic field and further reduces the required write current. Also, because of the sharp quality factor at ferromagnetic resonance, it is believed that the cells in an array will be more selective so that there is less likelihood of an adjacent cell being switched by the write currents in an addressed cell.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. MRAM write apparatus comprising:
    an MRAM cell including a free layer of magnetic material having a ferromagnetic resonance with an associated resonant frequency;
    a hard axis write line positioned in magnetic communication with the free layer of magnetic material;
    an easy axis write line positioned in magnetic communication with the free layer of magnetic material; and
    one of the hard axis write line and the easy axis write line being coupled to receive a write signal including the associated resonant frequency.

2. MRAM write apparatus as claimed in claim 1 wherein the ferromagnetic resonance has a quality factor greater than 1.

3. MRAM write apparatus as claimed in claim 1 wherein the free layer of magnetic material includes material and a shape and the associated resonant frequency is dependent on the material included in the free layer of magnetic material and the shape.

4. MRAM write apparatus as claimed in claim 1 wherein the free layer of magnetic material is formed with a longitudinal axis and a transverse axis with the hard axis line being oriented parallel to the transverse axis and the easy axis line being oriented parallel to the longitudinal axis.

5. MRAM write apparatus as claimed in claim 4 wherein the write signal including the associated resonant frequency is coupled to the hard axis.

6. MRAM write apparatus as claimed in claim 5 wherein a write signal including a pulse is coupled to the easy axis.

7. MRAM write apparatus as claimed in claim 6 wherein the associated resonant frequency is changed during application of the write signal including the pulse.

8. MRAM write apparatus as claimed in claim 6 wherein the associated resonant frequency is lowered during application of the write signal including the pulse.

9. MRAM write apparatus as claimed in claim 1 wherein the write signal including the associated resonant frequency includes a plurality of cycles at the associated resonant frequency.

10. MRAM write apparatus as claimed in claim 9 wherein the write signal includes an anharmonic signal including the associated resonant frequency.

11. MRAM write apparatus as claimed in claim 1 wherein the associated resonant frequency includes a uniform magnetization mode.

12. MRAM write apparatus as claimed in claim 1 wherein the associated resonant frequency includes a nonuniform magnetization mode.

13. MRAM write apparatus as claimed in claim 1 further including a cladding layer partially surrounding the one of the hard axis write line and the easy axis write line coupled to receive the write signal including the associated resonant frequency.

14. MRAM write apparatus as claimed in claim 13 wherein the cladding layer has a ferromagnetic resonance with a cladding layer resonant frequency substantially similar to the associated resonant frequency.

15. MRAM write apparatus as claimed in claim 14 wherein the cladding layer resonant frequency is dependent on the material included in the cladding layer of magnetic material and to width and thickness of the cladding layer.

16. MRAM write apparatus as claimed in claim 14 wherein the ferromagnetic resonance of the cladding layer has a quality factor greater than 1.

17. MRAM write apparatus comprising:
    an MRAM cell including a free layer of magnetic material;
    a hard axis write line positioned in magnetic communication with the free layer of magnetic material;
    an easy axis write line positioned in magnetic communication with the free layer of magnetic material;
    a cladding layer partially surrounding one of the hard axis write line and the easy axis write line, the cladding layer having a ferromagnetic resonance with a cladding layer resonant frequency; and
    the one of the hard axis write line and the easy axis write line partially surrounded by the cladding layer being coupled to receive a write signal including the cladding layer resonant frequency.

18. MRAM write apparatus comprising:
    an MRAM cell including a free layer of magnetic material with a ferromagnetic resonance having an associated resonant frequency, the ferromagnetic resonance of the free layer of magnetic material having a quality factor greater than 1, the free layer of magnetic material including material and a shape and the associated resonant frequency being dependent on the material included in the free layer of magnetic material and the shape;
    a hard axis write line positioned in magnetic communication with the free layer of magnetic material;
    an easy axis write line positioned in magnetic communication with the free layer of magnetic material; and
    the easy axis write line being coupled to receive a write pulse and the hard axis write line being simultaneously coupled to receive a write signal including a plurality of cycles at the associated resonant frequency.

19. MRAM write apparatus as claimed in claim 18 wherein the associated resonant frequency is changed during application of the write pulse.

20. MRAM write apparatus as claimed in claim 19 wherein the associated resonant frequency is lowered during application of the write pulse.

21. MRAM write apparatus as claimed in claim 18 further including a cladding layer partially surrounding the hard axis write line.

22. MRAM write apparatus as claimed in claim 21 wherein the cladding layer has a ferromagnetic resonance with a cladding layer resonant frequency substantially similar to the associated resonant frequency.

23. MRAM write apparatus as claimed in claim 22 wherein the cladding layer resonant frequency is dependent on the material included in the cladding layer of magnetic material and to width and thickness of the cladding layer.

24. MRAM write apparatus as claimed in claim 22 wherein the ferromagnetic resonance of the cladding layer has a quality factor greater than 1.

25. A method of writing or programming an MRAM cell comprising the steps of:
    providing an MRAM cell including a free layer of magnetic material having a ferromagnetic resonance with an associated resonant frequency;
    providing a hard axis write line positioned in magnetic communication with the free layer of magnetic material; providing an easy axis write line positioned in magnetic communication with the free layer of magnetic material; and
    applying a write signal including the associated resonant frequency to one of the hard axis write line and the easy axis write line.

26. A method as claimed in claim 25 wherein the step of applying the write signal includes applying the write signal to the hard axis.

27. A method as claimed in claim 26 further including a step of simultaneously applying a pulse to the easy axis.

28. A method as claimed in claim 27 wherein the step of applying the pulse to the easy axis lowers the associated resonant frequency.

29. A method as claimed in claim 25 wherein the step of applying the write signal including the associated resonant frequency includes applying a plurality of cycles at the associated resonant frequency.

30. A method as claimed in claim 25 wherein the step of applying the write signal includes applying an anharmonic write signal including the associated resonant frequency.

31. A method as claimed in claim 25 wherein the step of providing the MRAM cell including the free layer includes providing an MRAM cell wherein the associated resonant frequency includes a uniform magnetization mode.

32. A method as claimed in claim 25 wherein the step of providing the MRAM cell including the free layer includes providing an MRAM cell wherein the associated resonant frequency includes a nonuniform magnetization mode.

33. A method as claimed in claim 25 further including a step of providing a cladding layer partially surrounding the one of the hard axis write line and the easy axis write line coupled to receive the write signal including the associated resonant frequency.

34. A method as claimed in claim 33 wherein the step of providing the cladding layer includes providing a cladding layer having a ferromagnetic resonance with a cladding layer resonant frequency and the cladding layer resonant frequency is substantially similar to the associated resonant frequency.

35. A method of writing or programming an MRAM cell comprising the steps of:

providing an MRAM cell including a free layer of magnetic material having a ferromagnetic resonance with an associated resonant frequency, the ferromagnetic resonance having a quality factor greater than 1;

providing a hard axis write line positioned in magnetic communication with the free layer of magnetic material;

providing a cladding layer partially surrounding the hard axis write line, the cladding layer having a ferromagnetic resonance with a cladding layer resonant frequency approximately similar to the associated resonant frequency;

providing an easy axis write line positioned in magnetic communication with the free layer of magnetic material; and applying a write signal including the associated resonant frequency to the hard axis write line and simultaneously applying a write pulse to the easy axis write line.

36. A method of writing or programming an MRAM cell comprising the steps of:

providing an MRAM cell including a free layer of magnetic material;

providing a hard axis write line positioned in magnetic communication with the free layer of magnetic material;

providing an easy axis write line positioned in magnetic communication with the free layer of magnetic material;

providing a cladding layer partially surrounding one of the hard axis write line and the easy axis write line, the cladding layer having a ferromagnetic resonance with a cladding layer resonant frequency; and applying a write signal including the cladding layer resonant frequency to the one of the hard axis write line and the easy axis write line partially surrounded by the cladding layer.

* * * * *

UNITED STATES PATENT AND TRADEMARK OFFICE
CERTIFICATE OF CORRECTION

PATENT NO. : 6,351,409 B1  Page 1 of 1
DATED : February 26, 2002
INVENTOR(S) : Rizzo et al.

It is certified that error appears in the above-identified patent and that said Letters Patent is hereby corrected as shown below:

Column 1,
Line 2, after the Title, please add as a new first paragraph the following paragraph:
-- This invention was made with Government support under Agreement No. MDA972-96-3-0016 awarded by DARPA. The Government has certain rights in the invention. --

Signed and Sealed this

Fourth Day of May, 2004

JON W. DUDAS
*Acting Director of the United States Patent and Trademark Office*